United States Patent [19]
Ehrbar et al.

[11] 4,165,394
[45] Aug. 21, 1979

[54] METHOD OF PREPARATION OF A SUBSTRATE MADE OF PLASTIC MATERIAL FOR ITS SUBSEQUENT METALLIZATION

[75] Inventors: Jean-Paul Ehrbar, La Chaux-de-Fonds; Claude Ganguillet, Neuchatel, both of Switzerland

[73] Assignee: Ebauches S.A., Neuchatel, Switzerland

[21] Appl. No.: 875,563

[22] Filed: Feb. 6, 1978

[30] Foreign Application Priority Data

Feb. 16, 1977 [CH] Switzerland ............... 1887/77

[51] Int. Cl.² .................................................. B05D 3/06
[52] U.S. Cl. ..................................... 427/40; 427/300; 427/306; 427/259
[58] Field of Search .................. 427/306, 38, 39, 40, 427/35, 223, 300, 259

[56] References Cited

U.S. PATENT DOCUMENTS

| 3,317,339 | 5/1967 | Fortner et al. ...................... 427/223 |
| 3,362,841 | 1/1968 | Menikeim et al. .................. 427/223 |
| 3,471,320 | 10/1969 | Saubestre et al. .................. 427/306 |
| 3,686,018 | 8/1972 | Lindbloom et al. ................. 427/40 |
| 3,874,877 | 4/1975 | Omichi et al. ...................... 427/223 |
| 3,954,570 | 5/1976 | Shirk et al. ........................ 427/306 |
| 4,002,778 | 1/1977 | Bellis et al. ....................... 427/306 |

FOREIGN PATENT DOCUMENTS 52-49704 4/1976 Japan ........................................ 427/40

*Primary Examiner*—John H. Newsome
*Attorney, Agent, or Firm*—Silverman, Cass & Singer, Ltd.

[57] ABSTRACT

Method for pretreating a plastic substrate prior to metallization thereof by electroless metal deposition by applying a brush discharge thereto, the current density of which is higher than 0.5 mA/cm², the tension of which being less than the breakdown tension of the substrate and the total charge of energy applied being no higher than 20mC/cm²; the treatment comprising plural short spaced exposures of said substrate to said discharge. Various masking means are employed to provide selectively treated and untreated portions on the substrate.

4 Claims, 1 Drawing Figure

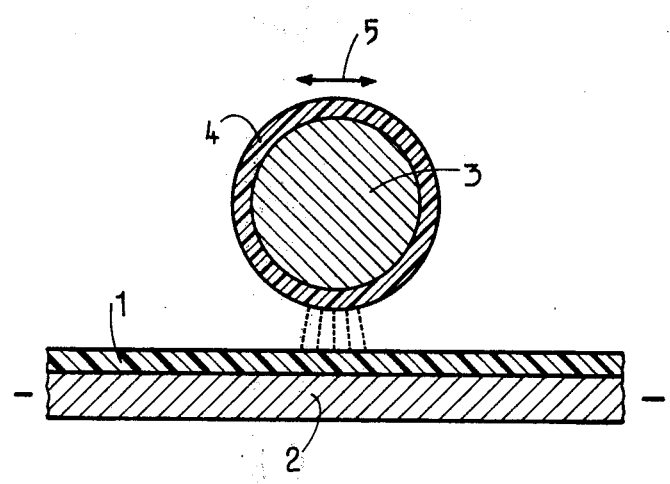

METHOD OF PREPARATION OF A SUBSTRATE MADE OF PLASTIC MATERIAL FOR ITS SUBSEQUENT METALLIZATION

The present invention relates to a method of preparation of a substrate made of plastic material for its subsequent metallization.

The necessity of metallizing substrates of plastic material is increasing by reason of the development of electronics. Numerous works have been realized these last years so as to permit to deposit, if possible directly and selectively, a layer of metal, especially of copper, adhering to an organic substrate. The chemical deposition of the copper, preceded by an also chemical conditioning of the surface of the substrate has been effected usually for several years and forms the subject of well-known techniques. But the great difficulty to be overcome during the metallization of an organic substrate is to obtain the adherence between the substrate and the layer of metal.

For the time being, the works which have been effected show that this adherence is acceptable only for some substrates, such as the acronitril-butadiene-styrene resins (also called ABS) and for the metallization of holes provided in the substrates of printed circuits using mostly glass-epoxy resins. Methods which use either of the substrates are relatively complicated and expensive. Extremely toxic chemical elements are employed, such as phosphorus or arsenic, so as to enable the coating of a widener range of organic substrates with a layer of adhering metal.

The main purpose of the present invention is to furnish a method which enables a strong adherence to be established between the metallic layer chemically deposited and an organic substrate, without making use of toxic chemical products. Moreover, this method enables the metallization of a wide range of polymers, while being applicable to a selective metallization, which brings effects only on a portion of the surface.

To this effect, the method according to the invention is characterized by the fact that one attacks the surface of the substrate to be metallized by brush or glow discharge, the said brush discharge being realized by Corona discharges applied by successive passages with a current density which is higher than 0.5 mA/cm2, the tension being lower than the break-down tension of the substrate, so as to prevent the deterioration of the latter, the density of total charge of energy thus applied being higher than 20 mC/cm$^2$, so as to prepare the said surface for metallization by chemical way.

It is known to treat plastic material by brush discharge but applying loads much lower than those hereabove mentioned for the purpose of cleaning for the subsequent application of ink or varnish, or for metallization thereof by evaporation under vacuum. The metallization under vacuum, even if preceded with a brush discharge, does not permit direct deposit of an adhering layer of copper. Such known technique furnishes adhering layers only if the first metallized coating is composed of chromium, or of nickel-chromium as indicated in the published Japanese Patent Application No 29.396/69.

The only FIGURE of the drawing shows diagrammatically, by way of example, an installation for carrying out the method according to the invention.

The present method can, for example, be put in practice in the case of a process of chemical metallization of workpieces made of plastic material occurring as follows:

The workpieces or films made of plastic material to be metallized are first cleaned in an aqueous alkaline solution of the trade, containing detergents, during a time of 5 minutes at 50° C. One will use to this effect sodium carbonate, sodium metasilicate, sodium phosphate, anionic and nonanionic wetting agents or still a detergent product used for the cleaning of metallic workpieces, in conjuction with a mechanic action such as a brushing.

One rinses the detergent treated surface with running water, then neutralizes same in hydrochloric acid diluted at a ratio of 1 to 3, during one minute, at room temperature.

Again rinsing is effected with running water, then under deionized or demineralized water, then is subjected to a drying under hot air.

Then comes the operation of brush discharge by Corona effect by means of the installation represented in the drawing:

The workpiece, i.e. a film 1 of polyethylene of 5×13 cm, is stretched on a metallic plate 2, formed for example of aluminum, which constitutes an electrode connected to one of the poles of a generator, for instance to the negative pole.

The other pole is connected to a metallic cylinder 3, constituting an electrode, covered with an insulating layer 4 for sake of safety, which is displaced, in a reciprocating movement in the direction of the arrow 5, parallel to the film 1 to be treated, at some millimeters of distance from the metallic plate 2, for instance 3 mm. One will realize in this way some 60 passages over the surface during a time of 1 to 2 minutes in the longitudinal direction. Consequently, each point of the surface of the film 1 is activated or attacked during the said passages.

This operation of brush discharge produces a rather strong increase of temperature which could be sufficient to burn the material of the substrate and, in the case of a film, to perforate it. Accordingly, movement of the electrode 3 enables the polymer to be cooled between two passages. For the same reason, the tension applied to the electrodes, in spite of the fact that it is much higher than the tensions used for the ordinary operations of brush discharge which serves only to clean the substrate, is maintained at a value lower than the break-down tension of the substrate. This tension will be of 13 kV for instance, The current density applied will have to be higher than 0.5 mA/cm$^2$, that is to say a load of 30 to 60 mC/cm$^2$.

It is to be noted that the distance of some millimeters between the electrode 3 and the surface of the workpiece to be treated is much lower than the distance conventionally provided in the usual cases of brush discharge carried out under vacuum vessel.

The workpiece having been prepared in this way, the actual operations of metallization can start:

Immediately after the brush discharge, the workpiece of polyethylene is immersed into a reducing solution, and that constitutes the first step of the metallization. The latter is effected while using the products of the trade which are furnished for instance by the American firm McDermid or German firm Schering.

The process of metallization consists in immersing the workpiece into an activation bath constituted by a reducing solution comprising ions $Sn^{+2}$, $Pd^{+2}$, as well as colloidal Pd, which is adsorbed by the surface of the polymer. The duration of the immersion in the activation bath will be of 10 minutes, this immersion being followed by a rinsing under running water.

The workpiece is then immersed into an acceleration bath constituted by a solution of the trade preparing the surface for the deposition of the metal, during about 1 minute, at room temperature.

After a new rinsing under running water, the workpiece is immersed into a bath of chemical copper, without utilization of any source of current, during 20 minutes and at room temperature. One will use a bath of the trade producing a reduction, by the formol, of a salt of copper, in alkaline medium.

It is to be noted that the chemical coppering must be effected at a determined speed of formation otherwise, in spite of the previous brush discharge, the adherence of the layer is not satisfying. The control of this speed of the deposition is effected while varying the pH of the bath of chemical copper, this speed increasing with the said pH. The latter must be adjusted at $12 \pm 0.2$ pH units. One has ascertained that, if the pH is too low, the deposition is formed too slowly and the activation layer of Pd is partially attacked. On the contrary, if the pH is too high, the deposition is formed too quickly for being conveniently crystallized. Strong inner tensions are then produced which diminish the adherence of the metal on the workpiece of polymer, in this case, of polyethylene.

Once the desired thickness of the deposition of copper is reached, the piece of polyethylene is rinsed under a jet of running water, then rinsed with deionized or demineralized water and then dried under hot air.

The experience shows that, owing the brush discharge effected in the indicated conditions, very diverse plastic materials can be metallized by chemical way with a satisfying adherence of the metallized layer. Satisfying results have also been obtained with materials of the family of the polyimides, of the polyhydantoins, of the ionomeres, of the epoxies, for instance.

The case of the polyethylene is specially demonstrative since it is a material very hard to render adherent to such metal coatings.

In a modified way of carrying out the infiltrates method, one can, in view of permitting the realisation of a metallized pattern on a substrate made of plastic material (selective metallization), effect the brush discharge according to this same pattern while using a shield or metallic stencil which will be placed on the workpiece of plastic material during the operation of brush discharge or under this workpiece, this shield then constituting the stationary electrode. This method, however, does not give perfect results as regards the sharpness of the pattern, by reason, probably, of the ozone which is formed during the treatment and which infiltrates between the shield and the workpiece to be treated.

The method is then continued, after the last operation of metallization, by a rinsing by means of a jet of running water. Owing to the increase of the adherence due to the brush discharge, the layer of copper is eliminated, during this strong rinsing, from the zones where the brush discharge has not been effected, while it maintains itself on the rest of the surface.

In another modification, one starts in effecting a first light brush discharge of the surface which is covered, by a method of printing such as serigraphy or offset, with a layer of varnish. This layer must be present in any place where one does not desire to have a metallic deposition. On the other side, the patterns which are desired to be metallized must be free of varnish.

When the varnish is dried as in an oven, one effects the treatment of brush discharge as disclosed hereabove, followed by the activation and by the acceleration. At this time, without drying the substrate, one removes the layer of varnish by means of a suitable solvent, one rinses the substrate under running water and one effects the metallization in the bath of chemical copper. The coating then is produced only on the portions of the surface which were not covered by the varnish.

The present method enables the preparation of workpiece surfaces of plastic material for deposition, by chemical way, not only of copper, but of several other metals like nickel, silver or gold.

It is to be noted that the method as disclosed is specially suitable for the production in small series. In the case of an industrial production, it could be desirable to work continuously, in which case the chain of production would comprise several stations of brush discharge, arranged in series, the several chemical steps being able to be incorporated into the chain.

What we claim is:

1. Method of preparation of a substrate made of plastic material for its subsequent metallization, characterized by the fact that one attacks the surface of the substrate to be metallized by brush discharge, the said brush discharge being realized by Corona discharges applied by successive passages with a density of current which is higher than 0.5 $mA/cm^2$, the tension being lower than the break-down tension of the substrate, so as to prevent the deterioration of the latter, the density of total charge of energy thus applied being higher than 20 $mC/cm^2$ so as to render the said surface able to be metallized by chemical way.

2. Method as claimed in claim 1, characterized by the fact that one effects from 20 to 100 successive passages of brush discharge in a time of the order of 1 to 5 minutes.

3. Method as claimed in claim 1, characterized by the fact that one applies against the substrate to be metallized a metallic stencil forming a shield and constituting, during the brush discharge, one of the electrodes, so that only the portions not covered by the said shield be rendered able to be metallized by chemical way.

4. Method as claimed in clam 1, characterized by the fact that, before proceeding to the brush discharge, one covers with varnish some portions of the substrate intended to remain unmetallized, so that the said portions are not able to receive a metallization by chemical way.

* * * * *